(12) United States Patent
Borel et al.

(10) Patent No.: US 6,521,942 B2
(45) Date of Patent: Feb. 18, 2003

(54) ELECTRICALLY PROGRAMMABLE MEMORY CELL

(75) Inventors: Joseph Borel, Saint Egrève (FR); Jean-Pierre Schoellkopf, Grenoble (FR); Constantin Papadas, Gières (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/928,147

(22) Filed: Aug. 10, 2001

(65) Prior Publication Data

US 2002/0001903 A1 Jan. 3, 2002

Related U.S. Application Data

(62) Division of application No. 09/276,003, filed on Mar. 25, 1999, now Pat. No. 6,297,093.

(30) Foreign Application Priority Data

Mar. 26, 1998 (FR) ............................................. 98 04005

(51) Int. Cl.[7] ............................................. H01L 29/788
(52) U.S. Cl. ..................................................... 257/316
(58) Field of Search .......................... 257/316; 438/257, 438/267

(56) References Cited

U.S. PATENT DOCUMENTS

| | | | |
|---|---|---|---|
| 4,620,361 A | 11/1986 | Matsukawa et al. | |
| 5,338,952 A | * 8/1994 | Yamauchi | 257/316 |
| 5,429,969 A | 7/1995 | Chang | |
| 5,554,869 A | * 9/1996 | Chang | 257/316 |
| 5,687,113 A | 11/1997 | Papadas et al. | |
| 5,707,897 A | 1/1998 | Lee et al. | |
| 5,736,443 A | 4/1998 | Park et al. | |
| 5,759,920 A | 6/1998 | Burns, Jr. et al. | |
| 5,760,435 A | 6/1998 | Pan | |
| 5,969,383 A | * 10/1999 | Chang et al. | 257/316 |

FOREIGN PATENT DOCUMENTS

JP    4-151852 A    5/1992

OTHER PUBLICATIONS

French Search Report from French Patent Application 98 04005, filed Mar. 26, 1998.

* cited by examiner

Primary Examiner—Wael Fahmy
Assistant Examiner—Michelle Estrada
(74) Attorney, Agent, or Firm—Wolf, Greenfield & Sacks, P.C.; James H. Morris; Gary Engleson

(57) ABSTRACT

The present invention relates to a method of manufacturing an electrically programmable memory cell with a lateral floating gate with respect to the control gate, including the steps of forming an insulated control gate on an active area; forming a thin insulating layer around the control gate; successively depositing a thin layer of a conductive material and a layer of an insulating material; anisotropically etching the insulating material to form spacers of this material; and removing the portions of the thin conductive layer which are not coated with the spacers.

26 Claims, 1 Drawing Sheet

ELECTRICALLY PROGRAMMABLE MEMORY CELL

RELATED APPLICATIONS

This application is a division of prior application Ser. No.: 09/276,003, filed on Mar. 25, 1999, entitled ELECTRICALLY PROGRAMMABLE MEMORY CELL, now allowed U.S. Pat. No. 6,297,093.

BACKGROUND OF THE INVENTION

1. Field of the Invention

The present invention relates to the field of memory cells which can be made in MOS technology.

More specifically, the present invention relates to a memory cell including a control gate and a floating gate in which the floating gate is arranged laterally with respect to the control gate.

2. Discussion of the Related Art

U.S. Pat. No. 5,687,113, issued to Constantin Papadas and Bernard Guillaumot, assigned to the present assignee and incorporated herein by reference, describes such a cell in which the floating gate is arranged laterally with respect to the control gate.

FIG. 1 shows a memory cell of the type of that described in the above-mentioned patent. The cell is formed in a single-crystal silicon substrate 1, more specifically in an active area of this substrate delimited by a thick oxide layer 2. The upper surface of the semiconductor substrate is coated with a thin silicon oxide layer 3 on which is formed a polysilicon control gate 4. The lateral walls of the polysilicon gate are insulated by a silicon oxide layer 5 and polysilicon spacers 7 and 8 are formed on either side of the gate. In the above-mentioned patent, conductive lateral spacers 7 and 8 are formed above respective source and drain extension areas 9 and 10. For example, if the substrate is of type P, the source and drain extensions are of type N. Further, the cell includes more heavily doped N⁺-type source and drain areas 11 and 12.

Of course, the cell illustrated in FIG. 1 is not finished. To finish it, contacts need to be established with the source, drain, and control gate regions. The cell may include a single lateral spacer 8 above a drain extension.

The cell of this prior patent of the applicant provides satisfactory results. However, it is not compatible with all MOS integrated circuit manufacturing technologies and requires a double level of polysilicon layers, the first level corresponding to the control gate and the second level corresponding to a layer from which spacers 7 and 8 have been formed.

SUMMARY OF THE INVENTION

Thus, the present invention aims at providing an electrically programmable memory cell in which the floating gate is lateral with respect to the control gate and which is particularly simple to manufacture by methods compatible with the methods of CMOS structure manufacturing.

To achieve these and other objects, the present invention provides a method of manufacturing an electrically programmable memory cell with a floating gate lateral (i.e. disposed laterally) with respect to the control gate, including the steps of forming an insulated control gate on an active area; forming a thin insulating layer around the control gate; successively depositing a thin layer of a conductive material and a layer of an insulating material; anisotropically etching the insulating material to form spacers of this material; and removing the portions of the thin conductive layer which are not coated with the spacers.

According to an embodiment of the present invention, the conductive material is doped polysilicon.

According to an embodiment of the present invention, the conductive material has a thickness from 5 to 20 nm.

According to an embodiment of the present invention, the insulating material is silicon nitride.

According to an embodiment of the present invention, the method further includes the step of oxidizing the apparent portions of the conductive areas.

The present invention also relates to a memory cell with a control gate and a lateral floating gate, including on the lateral walls of the control gate insulating spacers under which is arranged a thin layer of a conductive material.

The foregoing objects, features and advantages of the present invention will be discussed in detail in the following non-limiting description of specific embodiments in connection with the accompanying drawings.

DETAILED DESCRIPTION

In the method according to the present invention, as in the method according to prior art, the cell is formed in an active area of a single-crystal silicon substrate 1 delimited by a thick oxide region 2. The thick oxide region may be formed by any means and other methods of active area insulation may be used.

Figure 1:
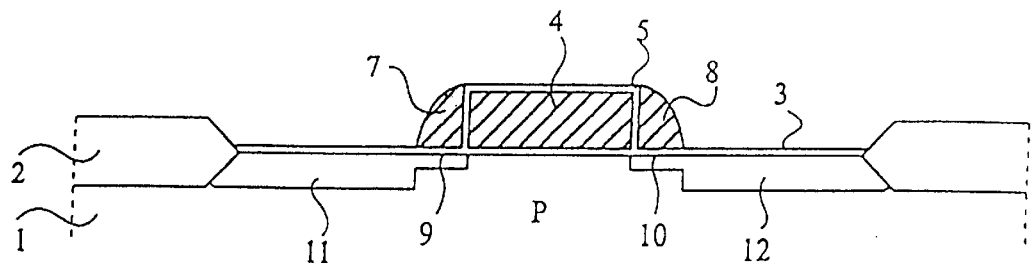
FIG. 1 shows a structure of an electrically programmable memory cell with lateral spacers according to prior art.
Figure 2A:
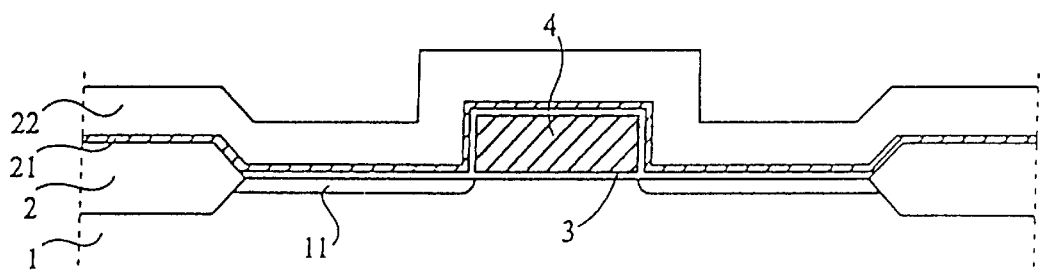
FIGS. 2A to 2C show successive steps of manufacturing of an electrically programmable memory cell with a lateral floating gate according to the present invention.

As illustrated in FIG. 2A, an insulated conductive gate 4 is formed on a gate insulating layer 3, currently a silicon oxide layer. Possibly, immediately after the formation of the gate, lightly-doped source and drain regions are formed by using the gate and the thick oxide as a mask. It should be noted that, according to an alternative, this step of lightly-doped source and drain region formation may be omitted.

Then, according to the present invention, a thin layer of a conductive material 21 is formed on oxide layer 3. This thin layer can for example have a thickness on the order of 5 to 20 nm only, for example, 10 nm. The conductive material may be polysilicon, doped in situ or doped by a subsequent implantation, or a metal. A layer of a thick insulator, preferably silicon nitride 22, is then deposited.

Figure 2B:
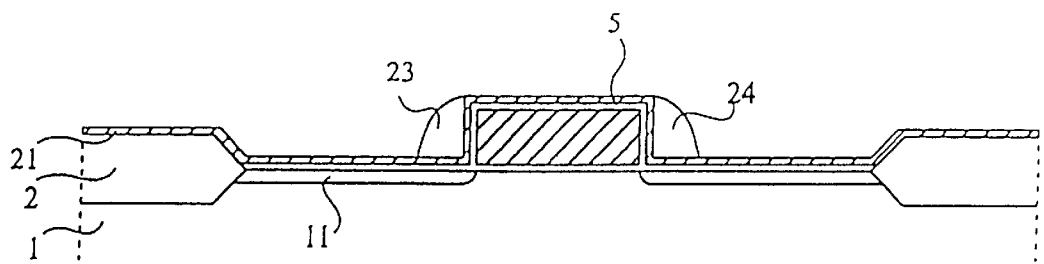

At the step shown in FIG. 2B, silicon nitride layer 22 is anisotropically etched to only leave in place spacers 23 and 24.

Figure 2C:
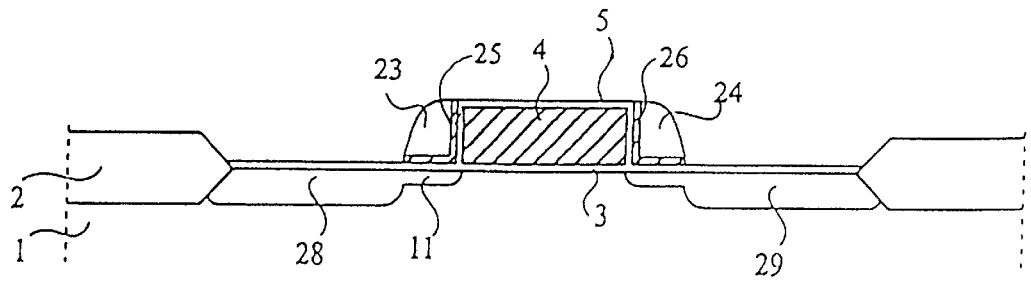

At a subsequent step shown in FIG. 2C, thin layer 21 of conductive material is removed wherever it is not covered with spacers 23 and 24 to only leave in place L-shaped regions 25 and 26. This removal may be performed by prolonging the etching performed to form spacers 23 and 24. Preferably, the step of FIG. 2C is followed by an oxidation step to oxide the apparent surfaces of L-shaped regions 25 and 26 forming a floating gate and make them insulating. This is possible if the conductive material forming layer 21 is an oxidizable material such as polysilicon or a properly chosen metal, for example, aluminum. This insulation by oxidation avoids any short-circuiting with subsequently formed metallizations. The formation of drain and source regions 28 and 29 has also been shown in FIG. 2C. Drain, source, and control gate contacts will then be conventionally made.

The operating mode of the cell according to the present invention will not be described in detail since it is identical to that described in the above-mentioned US patent. It should be noted that the provision of a very thin conductive layer is sufficient to ensure the floating gate function.

Of course, the present invention is likely to have various alterations, modifications, and improvements which will readily occur to those skilled in the art. In particular, as previously indicated, the floating gates will not necessarily be arranged above source and drain extension regions. Besides, the insulator arranged under the floating gates will be, according to the type of memory desired to be made, of an adequate thickness to operate by tunnel effect or not. A symmetrical or asymmetrical structure may also be provided, as discussed in the above-mentioned patent. Further, although the insulating material has been previously described as being silicon oxide, other insulating materials or combinations of insulating materials may be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory cell on a substrate, comprising:
   a control gate;
   a first floating gate including a first thin layer of conductive material, the first floating gate disposed adjacent to the control gate; and
   a first spacer disposed adjacent to the control gate;
   wherein the first thin layer of conductive material of the first floating gate is disposed between the first spacer and the substrate.

2. The memory cell of claim 1, wherein the first thin layer of conductive material has a thickness approximately between 5 nm and 20 nm.

3. The memory cell of claim 1, wherein the first thin layer of conductive material has an extent defined by the first spacer.

4. The memory cell of claim 1, wherein the first spacer is formed of an insulating material.

5. The memory cell of claim 4, wherein the first spacer is formed of silicon nitride.

6. The memory cell of claim 5, wherein the first spacer is formed of silicon nitride and the first floating gate is formed of doped polysilicon.

7. The memory cell of claim 1, further comprising:
   a second floating gate including a second thin layer of conductive material, the second floating gate disposed laterally adjacent to the control gate; and
   a second spacer disposed laterally adjacent to the control gate;
   wherein the second thin layer of conductive material of the control gate is disposed below the second spacer.

8. The memory cell of claim 7, further comprising:
   a source extension region disposed below the first thin layer of conductive material; and
   a drain extension region disposed below the second thin layer of conductive material.

9. A semiconductor component, comprising:
   a control gate having a vertical wall;
   a first floating gate, adjacent to the control gate, having a first vertical extension and a first horizontal extension, wherein the first vertical extension is parallel to the vertical wall and the first horizontal extension is substantially perpendicular thereto;
   a first insulating layer separating the control gate from the first floating gate; and
   a first insulating spacer disposed above the horizontal extension.

10. The semiconductor component of claim 9, wherein the first horizontal extension is thinner than the first insulating layer.

11. The semiconductor component of claim 9, wherein the horizontal extension has a thickness of approximately between 5 nm and 20 nm.

12. The semiconductor component of claim 9, wherein the first horizontal extension has an extent defined by the first spacer.

13. The semiconductor component of claim 9, wherein the first spacer is formed of an insulating material.

14. The semiconductor component of claim 10, wherein the first spacer is formed of silicon nitride.

15. The semiconductor component of claim 11, wherein the first spacer is formed of silicon nitride and the first floating gate is formed of doped polysilicon.

16. The semiconductor component of claim 9, further comprising:
   a second floating gate, adjacent to the control gate, having a second vertical extension and a second horizontal extension, wherein the second vertical extension is parallel to the vertical wall and the second horizontal extension is substantially perpendicular thereto;
   a second insulating layer separating the control gate from the second floating gate; and
   a second insulating spacer disposed above the second horizontal extension.

17. The semiconductor component of claim 16, further comprising:
   a source extension region disposed below the first horizontal extension; and
   a drain extension region disposed below the second horizontal extension.

18. A semiconductor component on a substrate, comprising:
   a control gate;
   a first spacer adjacent the control gate; and
   a first floating gate between the first spacer and the control gate, and between the first spacer and the substrate.

19. The semiconductor component of claim 18, wherein the control gate is enclosed by insulation.

20. The semiconductor component of claim 18, wherein the first floating gate has an extent defined by the first spacer.

21. The semiconductor component of claim 20, wherein the first floating gate has an L-shaped cross-section.

22. The semiconductor component of claim 18, wherein the first spacer is formed of an insulating material.

23. The semiconductor component of claim 22, wherein the first spacer is formed of silicon nitride.

24. The semiconductor component of claim 23, wherein the first spacer is formed of silicon nitride and the first floating gates is formed of doped polysilicon.

25. The semiconductor component of claim 18, further comprising:

a second spacer adjacent the control gate; and a second floating gate between the second spacer and the control gate, and between the second spacer and the substrate.

26. The semiconductor component of claim 25, further comprising:

a source extension region disposed below the first control gate; and a drain extension region disposed below the second control gate.

* * * * *